United States Patent [19]

Yokogawa et al.

[11] Patent Number: 5,099,357
[45] Date of Patent: Mar. 24, 1992

[54] OPTICAL SENSOR

[75] Inventors: Toshiya Yokogawa; Mototsugu Ogura, both of Nara, Japan

[73] Assignee: Matsushita Electric Industrial Co., Ltd., Osaka, Japan

[21] Appl. No.: 700,891

[22] Filed: May 10, 1991

Related U.S. Application Data

[63] Continuation of Ser. No. 266,896, Nov. 3, 1988, abandoned.

[30] Foreign Application Priority Data

Aug. 24, 1988 [JP] Japan .................. 63-210235

[51] Int. Cl.$^5$ .................. H01L 29/161; H01L 27/14; H01L 31/00
[52] U.S. Cl. .................. 359/282; 359/281; 359/283; 359/324; 359/585; 359/488; 357/16; 357/30
[58] Field of Search ............ 357/16, 30 B, 30 D, 357/30 E, 4; 359/281, 282, 283, 324, 585, 488

[56] References Cited

U.S. PATENT DOCUMENTS

| | | | |
|---|---|---|---|
| 3,707,321 | 12/1972 | Jaecklin et al. | 359/282 |
| 4,560,932 | 12/1985 | Mitsui et al. | 359/324 |
| 4,686,678 | 8/1987 | Ohta et al. | 357/74 |
| 4,793,872 | 12/1988 | Mennier et al. | 357/16 |
| 4,795,233 | 1/1989 | Chang | 359/488 |
| 4,823,177 | 4/1989 | Prinz et al. | 357/27 |
| 4,869,569 | 9/1989 | Kapon | 350/96.14 |
| 4,984,875 | 1/1991 | Abe et al. | 359/281 |
| 4,987,472 | 1/1991 | Endo et al. | 357/61 |

Primary Examiner—Andrew J. James
Assistant Examiner—Ngan Van Ngo
Attorney, Agent, or Firm—Wenderoth, Lind & Ponack

[57] ABSTRACT

An optical sensor excellent in reliability and mass producibility and low in cost, by forming a magnetic optical crystal, polarizer and analyzer monolithically on the same substrate.

8 Claims, 11 Drawing Sheets

OPTICAL SENSOR

This application is a continuation of now abandoned application Ser. No. 07/266,896 filed on Nov. 3, 1988.

BACKGROUND OF THE INVENTION

This invention relates to an optical sensor for use in optical measurement.

Recently, optical components such as laser diodes, detector, and optical fibers have been developed intensively. As they are advanced in performance, high precision optical measurements by using optical sensor can be realized. These components are attracting wide attention owing to their advantages, such as freedom from electromagnetic induction noise, high insulation, and low loss of optical fiber. In particular, attempts have been made to widely use optical magnetic (current) sensors in high voltage cables or the like by making use of such advantages.

FIG. 1 shows a system configuration of an optical magnetic sensor. The light from a light source 101 provided in an optical transmitter 100 enters a sensor unit 103 by way of an optical fiber 102. The magnetic field intensity is converted into an optical intensity in the sensor unit 103, and the light runs again through the optical fiber 102, and is converted into an electric signal at a detector 104 provided in an optical receiver 105. Then, the signal is processed in the signal processing unit. The sensor unit 103 is mainly composed of a polarizer 107, a magnetic optical crystal 108, and an analyzer 109.

FIG. 2 shows the composition of a conventional sensor unit. The light passed through a polarizer 201 becomes a straight polarized light, and it passes through a magnetic optical crystal 202 having a certain length, and at this time the plane of polarization is rotated by an angle $\theta$ proportional to the optical path length and external magnetic field. The angle of rotation $\theta$ is converted into an optical intensity by an analyzer 203 disposed at an angle of 45 degrees to the polarizer 201. The quantity of light after passing through the analyzer 203 is proportional to the angle of rotation $\theta$.

The thus described sensor unit, however, involves the following problems. The sensor unit is composed of a crystal 202 having a magnetic optical effect, a flat plate polarizer using rutile or the like (polarizer 201, analyzer 203), prism 204, rod lens 205 and others, which means that there are too many component parts. Accordingly, (1) it is very difficult to match the optical axia at high precision, (2) when adhering the individual parts by thermoset adhesive or the like, it is necessary to fix the optically adjusted parts for a long time at high temperature, and it is likely that the optical axis becomes deviated at this time, (3) the adhesive is poor in reliability, and peeling may occur when used for a long time, and (4) mass production is difficult because each part must be individually adhered.

SUMMARY OF THE INVENTION

It is hence a primary object of this invention to present an optical sensor excellent in reliability and mass producibility, and low in cost, by monolithically integrating the optical components to compose a sensor unit.

This invention presents an optical sensor possessing at least one polarizer composed of alternate and multiple laminates of epitaxially grown/magnetic optical crystals such as a II-VI compound and a III-V compound, or a garnet crystal, and a metal and dielectrics, on a substrate, for example, GaAs, Si, gadolinium-gallium-garnet (GGG) or Ca-Mg-Zr substitute GGG.

This invention also presents an optical sensor comprising a first semiconductor having a lower refractive index than that of a semiconductor substrate at a specific wavelength (for example, $\lambda = 0.6328$ $\mu$m) on a semiconductor substrate such as GaAs, InP, and Si, and a second semiconductor substrate having a higher refractive index than that of the semiconductor layer on ZnS and its semiconductor layer, for example a ZnSe, ZnSSe, and ZnSe/ZnS superlattice layer.

This invention further presents an optical sensor in a structure possessing stripes of a first semiconductor layer such as $Al_{0.2}Ga_{0.8}As$ on a semiconductor substrate such as GaAs, InP and Si, and a second semiconductor layer such as $Al_{0.3}Ga_{0.7}AsGaAs$ superlattice layer having a higher refractive index than that of the semiconductor at a specific wavelength (for example $\lambda = 1.15$ $\mu$m) in a stripe shape on the semiconductor layer, in which the stripes are buried by emitting protons to a third semiconductor layer, for example, a super-lattice disordering layer, having a higher absorption coefficient than that of the second semiconductor layer while having a lower refractive index than that of the second semiconductor layer.

While the novel features of the invention are set forth in the appended claims, the invention both as to organization and content, will be better understood and appreciated, along with other objects and features thereof, from the following detailed description taken in conjunction with the drawings.

DETAILED DESCRIPTION OF THE PREFERRED EMBODIMENTS

Figure 1:
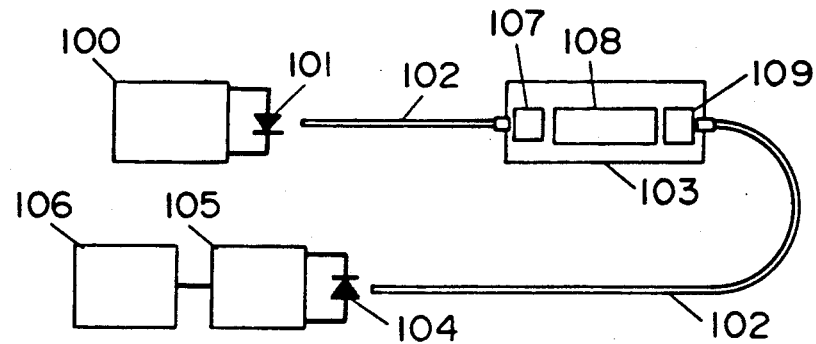
FIG. 1 is a system block diagram of a conventional optical magnetic field sensor.
Figure 2:
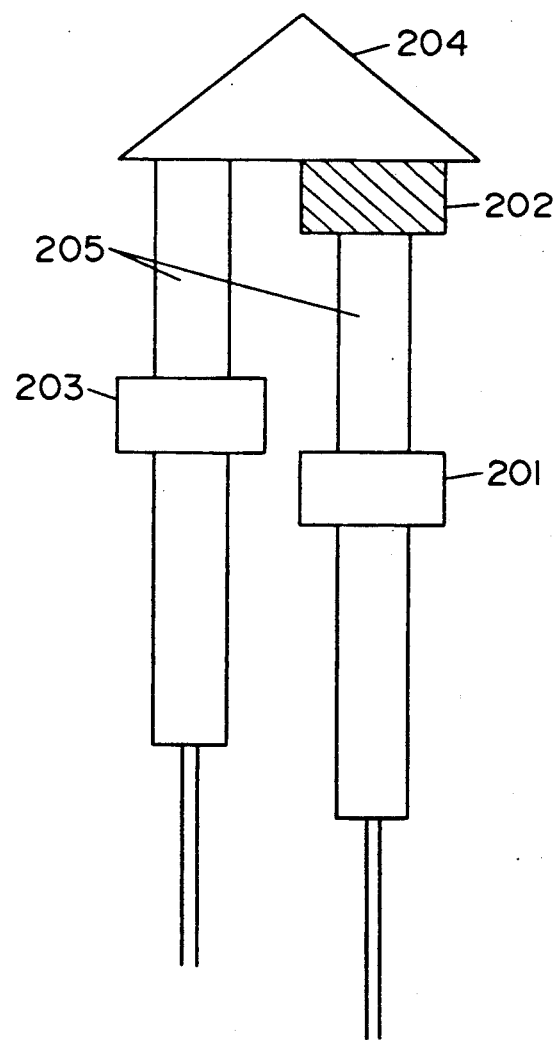
FIG. 2 is a structural drawing of a conventional optical magnetic field sensor head.
Figure 3A:
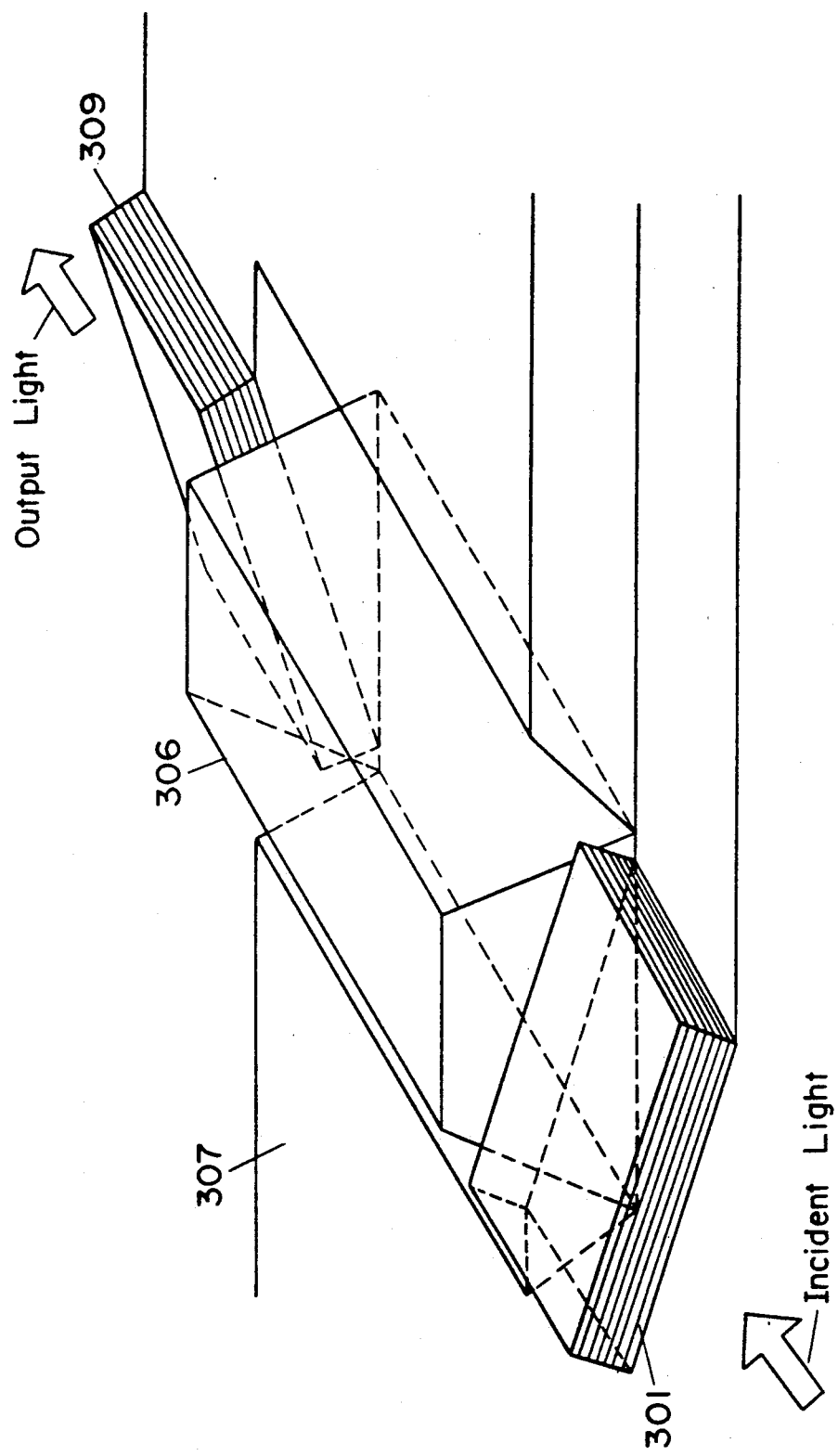
FIGS. 3A-3C are perspective views of a first optical magnetic field sensor unit in a first embodiment of the invention.
Figure 3B:
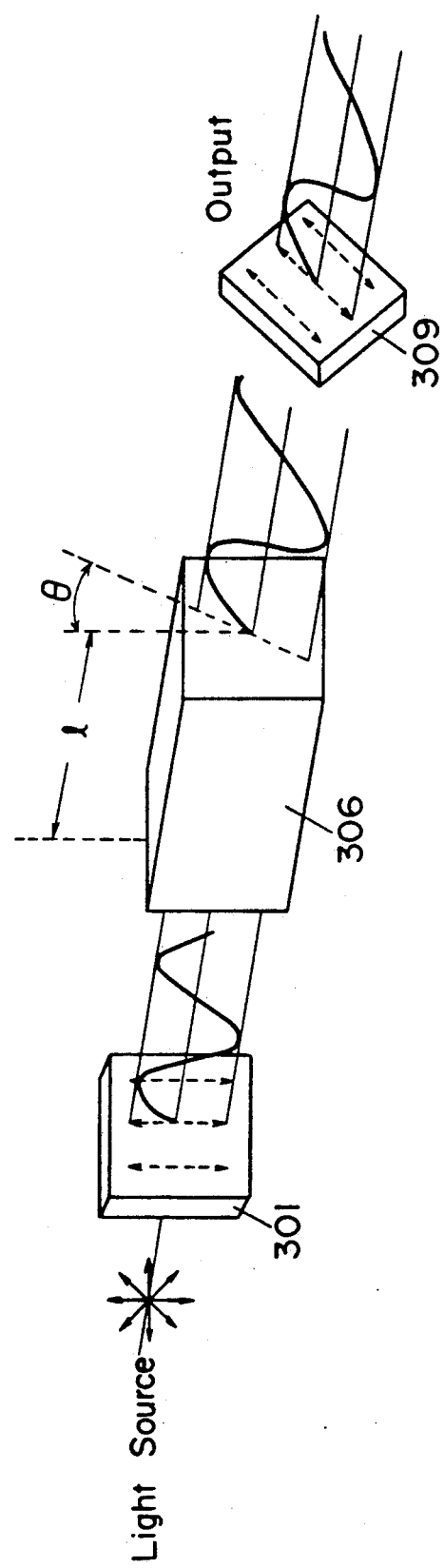
Figure 3C:
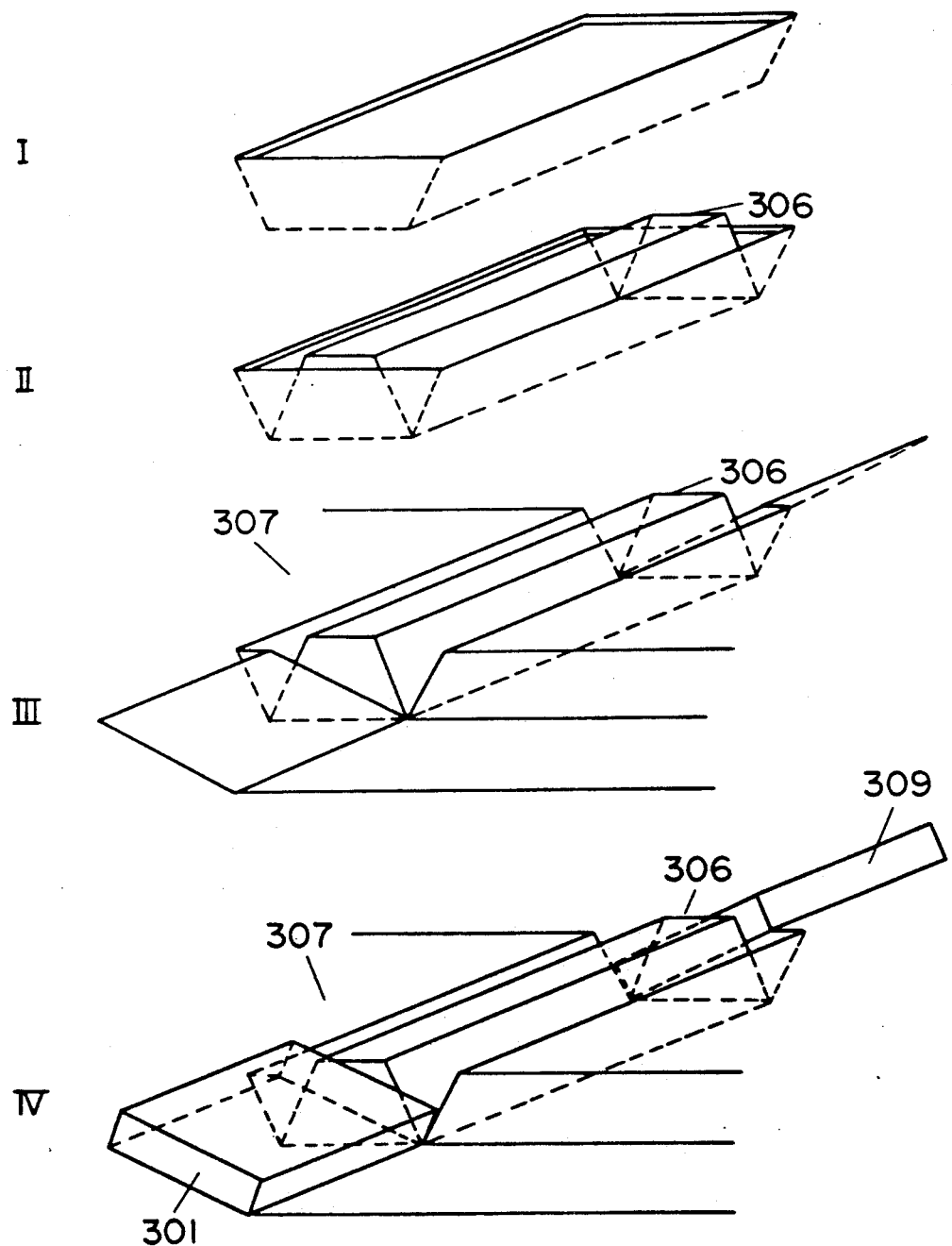

A perspective view of a first optical magnetic field sensor in a first embodiment of the invention is shown in FIG. 3 (a), in which the numeral 306 is a ZnSe epitaxial layer which is a magnetic optical crystal, and the film thickness is 70 μm. Numerals 308 and 309 are metal-dielectric multilayer films which are a polarizer and an analyzer. Using Al as the metal and SiO$_2$ as the dielectric, each layer thickness is 50° Å and 7800° Å, and 100 period are laminated alternately. Numeral 307 is a GaAs substrate in which a preliminarily etched step is formed. The principle of operation as a sensor is shown in FIG. 3 (b). The light being led from the fiber passes through the polarizer 308 shown in the drawing, and the light becomes a straight polarized light, and enters the ZnSe epitaxial layer 306. However, when a single mode polarization retaining fiber is used as the fiber, the polarizer 308 is not needed. When the light passes through this ZnSe epitaxial layer 306, the plane of polarization is rotated by an angle $\theta$ proportional to the optical path length (5 mm) and external magnetic field. The light passing through the ZnSe epitaxial layer 306 enters the analyzer 309, and the quantity of light after passing through the analyzer 309 changes in proportion to the value of the angle of rotation $\theta$.

The manufacturing method of this device is explained next (FIG. 3 (C)). In this invention, an organic metal vapor phase growth method is used as the epitaxial growth method. First of all, after properly pretreating the GaAs substrate, SiO$_2$ film is deposited by 1000° Å, and this SiO$_2$ film is selectively removed in a stripe of 5 mm × 10 82 m having the longer side in the direction of $<0\bar{1}1>$. Using it as the mask, stripe grooves are formed in the substrate by using an oxalate etchant (FIG. 3 (C) (I)). The four sides of the stripes have (LLL) A planes, and the bottom is the (100) plane. The depth of the stripes is 50 μm. On this substrate, a ZnSe epitaxial layer is formed. The condition of growth is, however, variable depending on the apparatus, but, for example, in the case of ZnSe, a favorable epitaxial film is obtained at a substrate temperature of 550° C., an H$_2$ flow rate (0° C.) of dimethyl zinc (DMZ) of 2.5 cc/min, an H$_2$ flow rate (15° C.) of dimethyl selenium (DMSe) of 9 cc/min, an H$_2$ total flow rate of 1.5 liters/min, and a reduced pressure of 100 Torr or less, and a ZnSe epitaxial layer of mesastripe is formed because of the selective growth only on the stripe grooves (FIG. 3 (C) (II)). Afterwards, the SiO$_2$ film is selectively removed, and formation of an etching mask and a dry etching are carried out twice to form a shaded portion in order to compose the polarizer (FIG. 3 (C) (III)). The shaded portions at both ends of the ZnSe epitaxial layer have an inclination of about 22 degrees with respect to a plane of (100) of the substrate, and are configured to cross at 45 degrees mutually. On the thus composed shaded area, the metal-dielectric multilayer, thin films composed of a polarizer and an analyzer are formed (FIG. 3 (C) (IV)). These laminate films are formed by reciprocally moving the sample between devices alternately, by using the apparatus obtained by joining the high frequency sputtering device and vacuum evaporation device and separating the middle part by a gate valve. The temperature of the SiO$_2$ sputtering and Al evaporation is 300° C., and there is no risk of deterioration of crystals or occurrence of defects.

Meanwhile, by using the single mode polarization retaining fiber, the light of straight polarized light can be led up to the sensor unit, and the polarizer 308 may be omitted when the intrinsic axis of the single mode polarization retaining fiber and the analyzer 309 are inclined by 45 degrees. In this case, it is enough to form the analyzer 309 only on the (100) plane of the substrate, without having to form on the shaded area of the substrate.

In this embodiment, meanwhile, the magnetic optical crystal is formed by using the technique of selective epitaxial growth, but it is also possible to form the mesastripe crystal by selective etching employing the technique of photolithography. As the magnetic optical crystal, ZnSe is used, but ZnS and ZnS$_x$Se$_{1-x}$ ($0<x<1$) may be also used, or the optical waveguide may be also formed in a sandwich structure of, for example, ZnS/ZnSe/ZnS or ZnS/ZnSSe/ZnS.

Still more, in this embodiment, a II–IV semiconductor was used as the magnetic optical crystal, but II–V semiconductor may be also used. Below is shown an example of the epitaxial growth conditions of GaAs or AlGaAs. In the case of GaAs, the H$_2$ flow rate of trimethyl gallium (TMG) (−15° C.) is 9 cc/min and the flow rate of arsine (AH$_3$) (10%) is 500 cc/min, and in the case of Ga$_{0.8}$Al$_{0.2}$As, the H$_2$ flow rate of TMG (−15° C.) is 8 cc/min, the H$_2$ flow rate of trimethyl aluminum (TMA) (20° C.) is 4 cc/min, and the flow rate of AH$_3$ (10%) is 500 cc/min. The total H$_2$ flow rate is 5 liters/min, and the reduced pressure is 10 Torr, and in this condition the growth was executed and the growth temperature was 700° C. For this selective epitaxial growth, a SiN$_x$ or SiO$_2$ mask was used. In this growth condition, the precipitation of polycrystals did not occur on the mask, and favorable crystals were obtained only on the exposed portion of the GaAs susbtrate. The GaAs crystals obtained in this condition may be also used as magnetic optical crystals of a high quality.

As an application of this sensor, furthermore, it is also possible to form a device of the invention on a substrate on which laser diode and detector are preliminarily formed.

Figure 4:
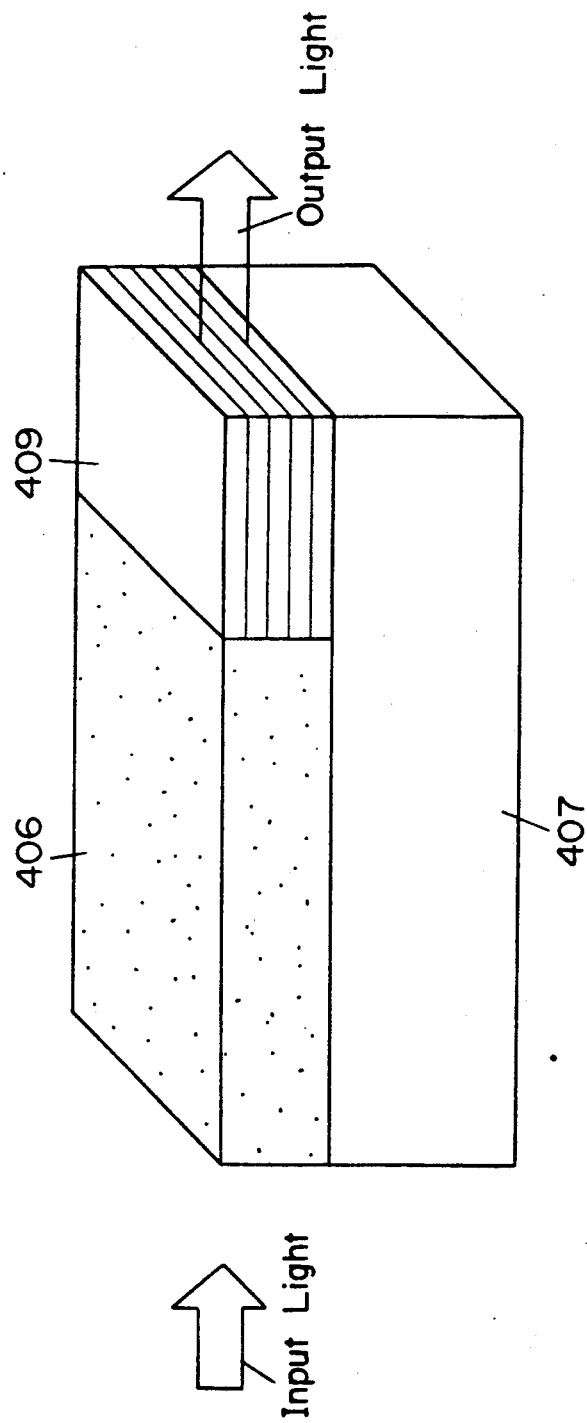
FIG. 4 is a perspective view of a second optical magnetic field sensor in the first embodiment of the invention.

A second optical magnetic field (current) sensor using garnet as magnetic optical crystal as a first embodiment of the invention is described below while referring to FIG. 4. Using a gadolinium-gallium-garnet (GGG) as the substrate, (Tb$_{0.19}$Y$_{0.81}$)$_3$Fe$_5$O$_{12}$((TbY)IG) 406 was grown by liquid phase epitaxial growth by using PbO-B$_2$O$_3$ solvent. The crystal in this composition has an advantage that the thermal stability is excellent as a sensor. The thickness of the grown crystal is 100 μm. On this crystal, by using the technique of dry etching, the portion for forming the analyzer 409 of the crystal plane is formed by 100 μm in the direction. Later, the bottom which is undulated as a result of dry etching is flattened by bias sputtering of SiO$_2$, and then the metal-dielectric thin film, which is the analyzer 409, is formed in the same procedure as in the embodiment 1. Using this single mode polarization retaining fiber, the light of the straight polarized light can be led up to the sensor unit, so that only one polarizer may be enough, by omitting the other polarizer and inclining the intrinsic axis of the single mode polarization retaining fiber and the analyzer 409 by 45 degrees. Next, this crystal is cut out to a length of about 2 to 10 mm and width of about 300 μm by means of diecing saw or the like, thereby forming a sensor unit.

Besides, as the garnet crystal, for example, when a Bi substitutional garnet such as Bi$_{1.2}$Y$_{1.8}$Fe$_5$O$_{12}$ is used, since the Faraday rotational angle per unit length is large, a high sensitivity sensor unit may be obtained. At this time, since the ion radius of Bi is large, Ca-Mg-Zr substitutional GGG having a large lattice constant is needed as the substrate. The plane of the straight polarized light of the input light is inclined by 45 degrees to the analyzer 409.

Figure 5:
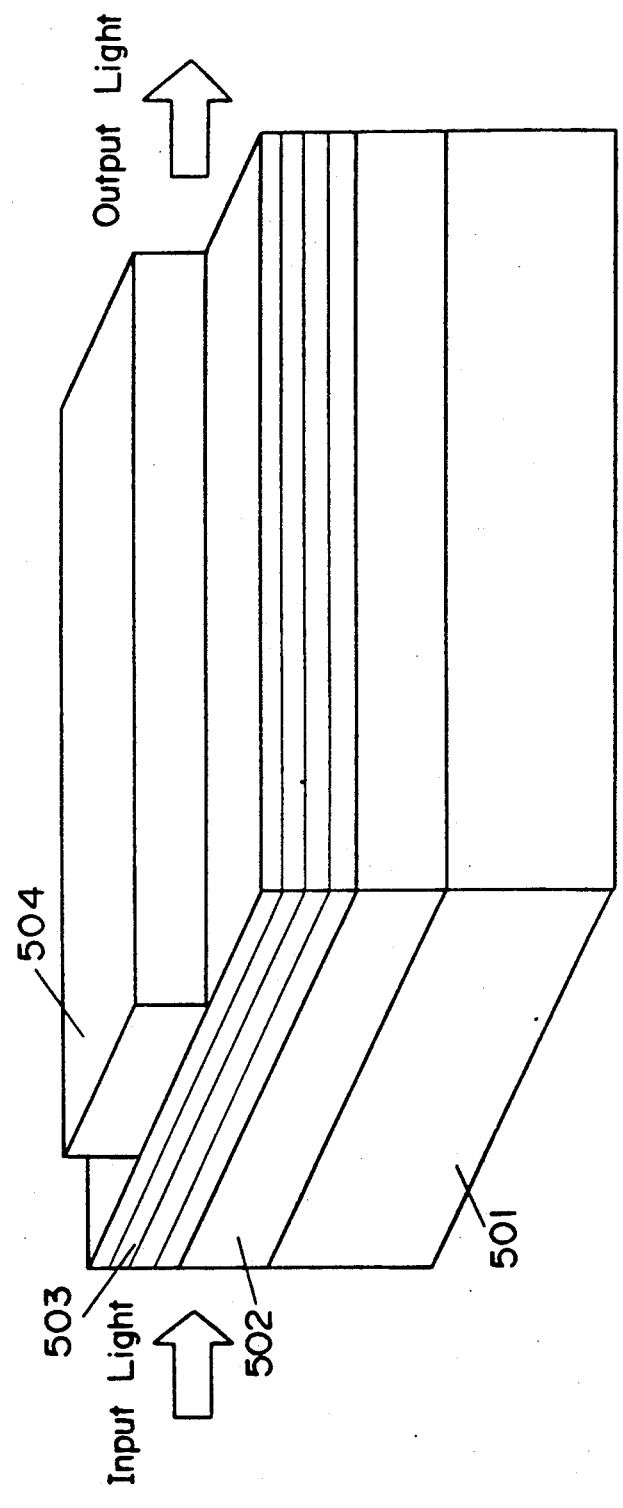
FIG. 5 is a perspective view of an optical magnetic field sensor unit in a second embodiment of the invention.

A perspective view of an optical sensor unit in a second embodiment of the invention is shown in FIG. 5, in which numeral 501 is a GaAs substrate, 502 is a ZnS cladding layer as a first semiconductor layer, 503 is a ZnSe/ZnS superlattice guiding layer as a second semiconductor layer, and 504 is an $SiO_2$ cladding layer. The film thickness of the ZnS cladding layer 502 was defined at 0.4 $\mu$m, and that of the $SiO_2$ cladding layer 504 was 0.5 $\mu$m. The superlattice guiding layer 503 is a superlattice of ZnSe 25A, ZnS 50A, 100 periods. The structure is of mounting type by $SiO_2$ stripe, and the stripe width was 6 $\mu$m and the device length was 5 mm. In this structure, in the case of He-Ne laser light of $\lambda = 0.6328$ $\mu$m, the propagation loss to TE wave was $\alpha = 1$ cm$^{-1}$, but it was $\alpha = 24$ cm$^{-1}$ to TM wave, and a large extinction ratio was observed between TE wave and TM wave. The light of a straight polarized light led in by single mode polarization retaining fiber enters from one end of the ZnSe/ superlattice guiding layer 503 at an inclination of in respect to 45 degrees of the plane of polarization to the interface. When the light passes through this guiding layer 503, the plane of polarization is rotated by an angle $\theta$ proportional to the length (5 mm) of the devices and the external magnetic field. In the case of a 45-degree input, the light is separated into a TE wave component and a TM wave component at an equal optical intensity. When this plane of polarization is rotated by a certain angle by the external magnetic field, the optical intensity of the TE wave component increases and the optical intensity of the TM wave component decreases, the quantity of light after passing through this device is increased because the propagation loss of the TE wave is smaller than that of TM wave. Therefore, the external magnetic field can be detected by this change in the quantity of light.

Figure 6:
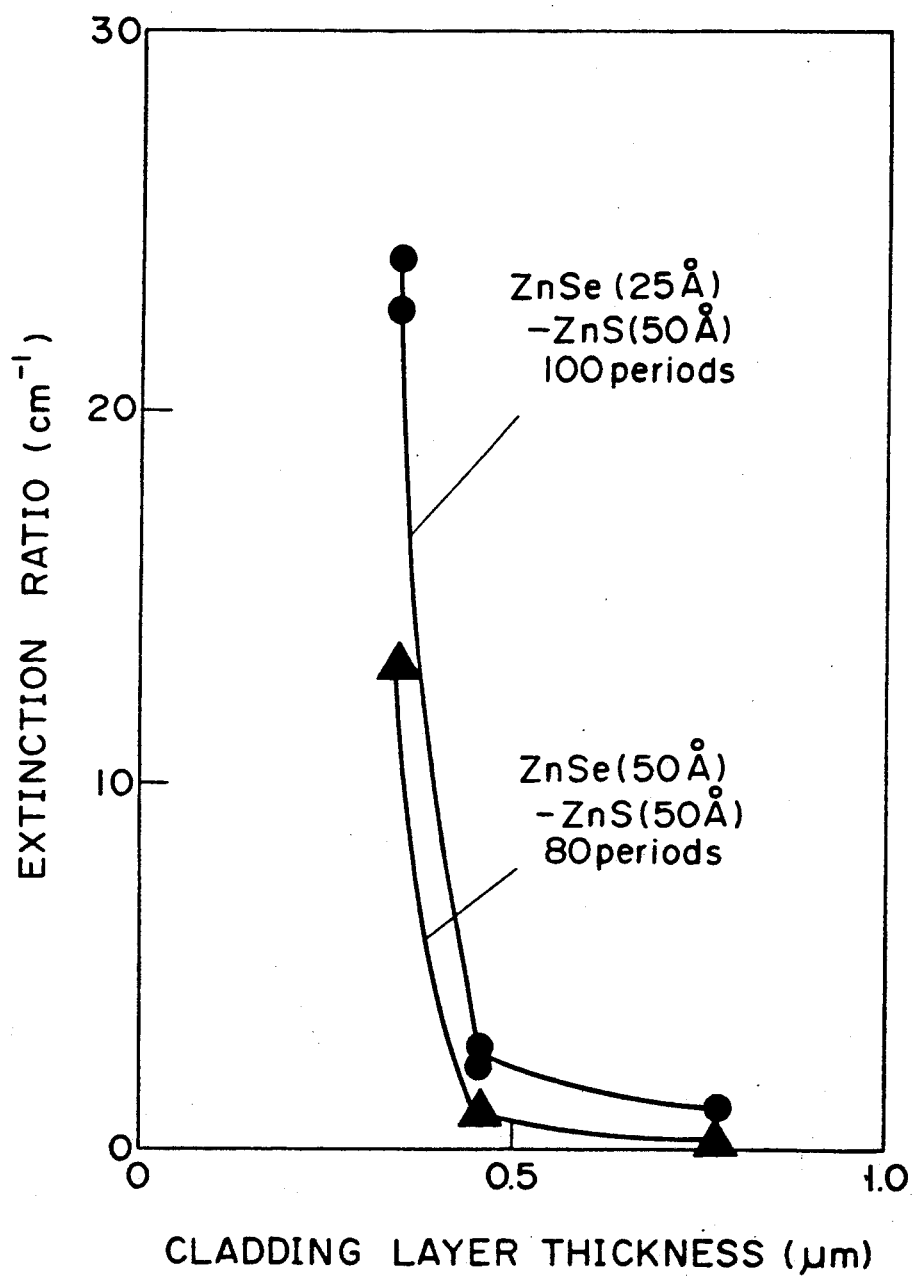
FIG. 6 shows the ZnS layer thickness dependence of the TE/TM extinction ratio in a device using the second embodiment of the invention.
Figure 7:
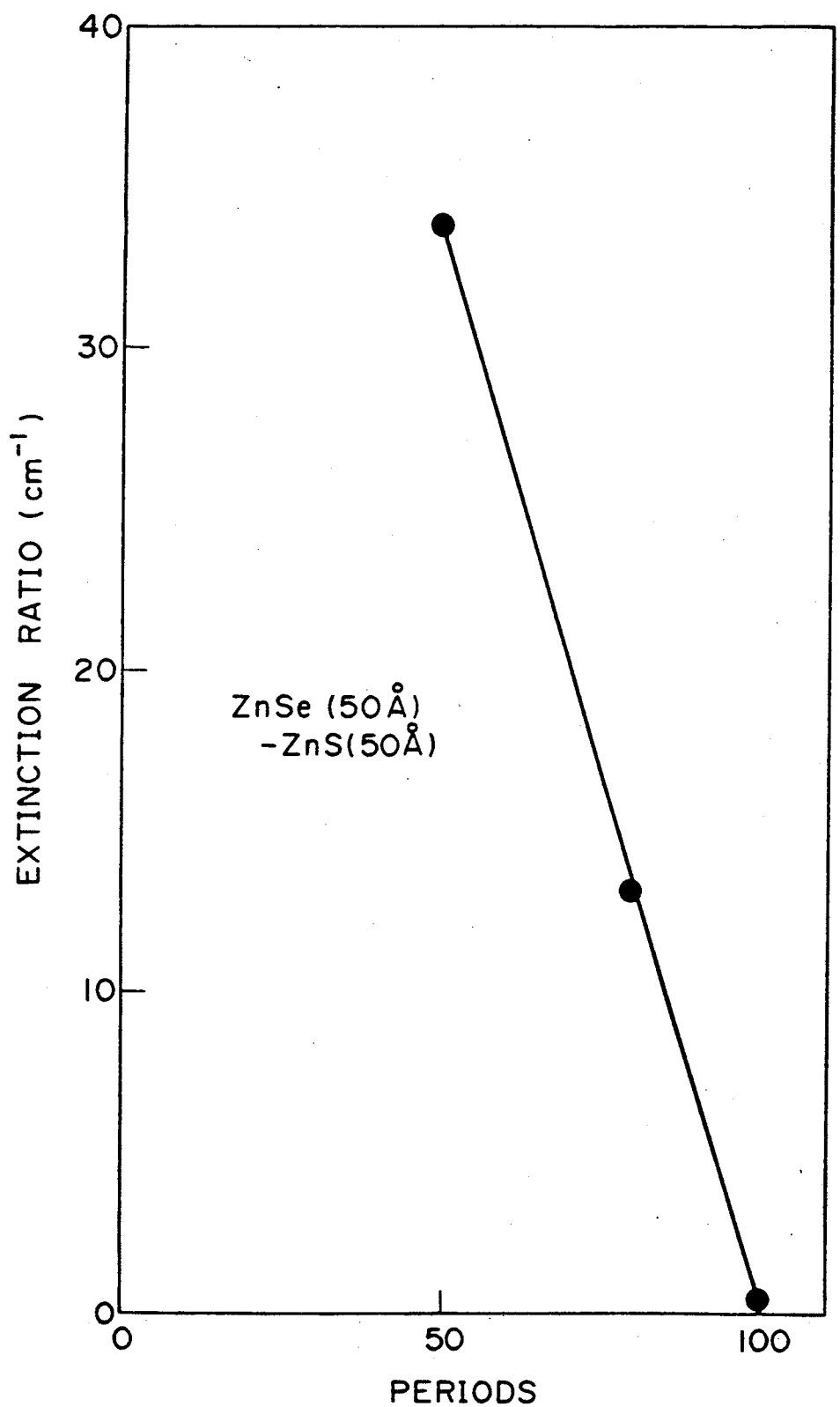
FIG. 7 shows the optical waveguide thickness dependence of the TE/TM extinction ratio in a device using the second embodiment of the invention.

In this embodiment, the following two reasons are known as the cause of the great differences in the propagation loss between a TE wave and a TM wave. First, the light con profile of a TE wave and a TM wave is greatly different because of the birefringence of this guiding structure, and the TM wave is mainly absorbed by the GaAs substrate as the absorption layer; second, the cutoff condition of the TE wave and the TM wave is greatly different at the symmetric four-layered waveguide having a layer (in this invention, the GaAs substrate) higher in refractive index than the cladding layer. The difference in the propagation loss between the TE wave and the TM wave greatly depends on the structure of the waveguide, for example, the film thickness of the ZnS cladding layer 502 or that of ZnSe/ZnS superlattice guiding layer 503. FIG. 6 shows the dependence on the film thickness of the ZnS cladding layer 502 of the TE/TM extinction ratio in the device using the second embodiment of the invention. A slab waveguide was evaluated in this case. When the film thickness of the ZnS cladding layer 502 becomes smaller than 0.5 $\mu$m, the difference in the propagation loss between the TE wave and the TM wave increases suddenly. FIG. 7 shows the dependence on the film thickness of the ZnSe/ZnS superlattice guiding layer 503 of the TE/TM extinction ratio. The superlattice period on the axis of abscissas is proportional to the film thickness of the guiding layer 503, and 100 periods correspond to 1 $\mu$m of the film thickness of the guiding layer 503. As the period of the superlattice decreases, the difference in the propagation loss increases. Considering these results, it seems that the difference in the propagation loss is related with the oozing of the TM waves into the GaAs substrate.

Furthermore, a similar effect may be expected by using AlGaAs in the first semiconductor layer, and a AlGaAs/GaAs multiquantum well layer or GaAs as the second semiconductor layer. Or, GaAs may be used as the substrate, InP as the first semiconductor layer, and InGaAsP/InP multiquantum well layer or InGaAsP as the second semiconductor layer.

Figure 8:
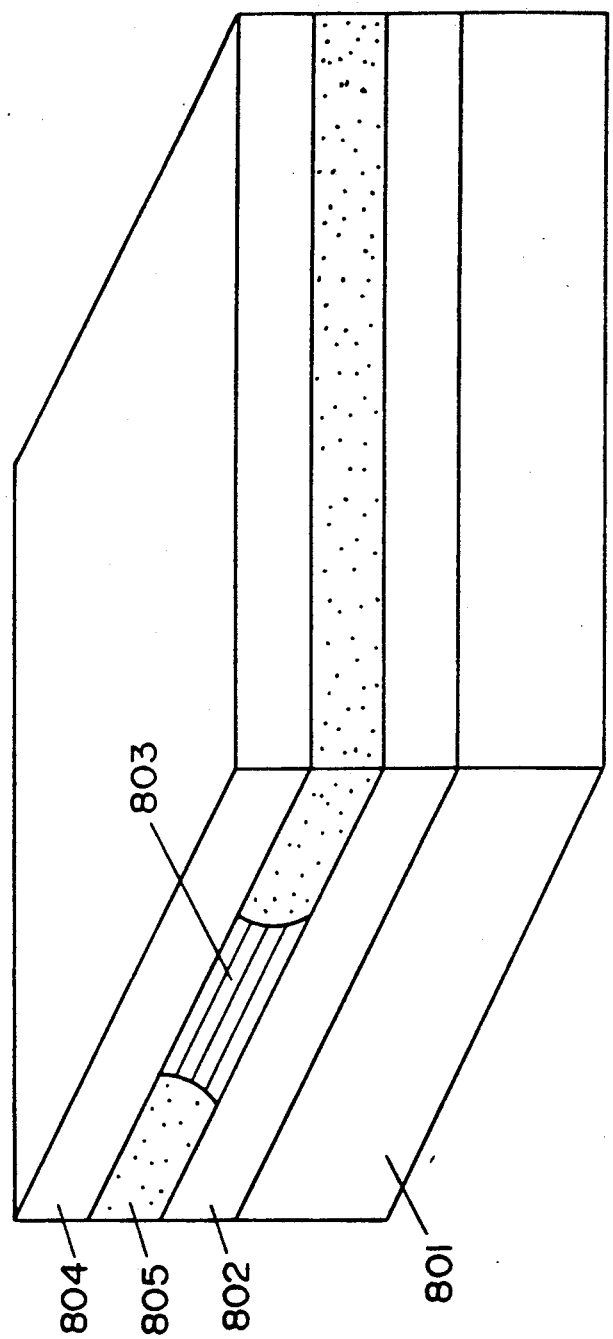
FIG. 8 is a perspective view of an optical magnetic field sensor in a third embodiment of this invention.

FIG. 8 shows a perspective view of an optical magnetic field sensor in a third embodiment of the invention, in which numeral 801 is a GaAs substrate, 802 is an $Al_{0.2}Ga_{0.8}As$ cladding layer as a first semiconductor layer, 803 is an $Al_{0.3}Ga_{0.7}As$ superlattice guiding layer as a second semiconductor layer, and 804 is an $Al_{0.2}Ga_{0.8}As$ cladding layer. The superlattice guiding layer 803 is a superlattice of $Al_{0.3}Ga_{0.7}As$ 100A, GaAs 100A, and 100 periods. For the purpose of three-dimensional optical confinement, after Si ion implantation leaving stripes of the guiding area, the superlattice is disordered by diffusion, and then a three-dimensional optical waveguide is formed. The width of the waveguide was 9 $\mu$m, and its length was 5 mm. Afterwards, by implanting proton into the region 804 in which Si was diffused, the optical absorption of the region was increased. This region corresponds to the third semiconductor layer.

In such optical waveguide structure, birefringence is present, and the refractive index to the TE wave and the TM wave is slightly lower in the TM wave. Accordingly, in the TM wave, the confinement in the lateral direction of the optical wave is weak, and the TM wave widely oozes out into the disordered region 805. In this region 805 having proton implantation, since the, optical absorption coefficient is high, the oozing TM wave is mostly absorbed in this region, and hence the propagation loss to the TM wave is heightened. When the wavelength of the laser beam was $\lambda = 1.15$ $\mu$m, the propagation loss of the TE wave was extremely low at $\alpha = 0.01$ cm$^{-1}$, but in the case of the TM wave it was $\alpha = 25$ cm$^{-1}$, and a great extinction ratio was obtained. When such optical waveguide was used, the operation was favorable as the optical magnetic sensor same as in the second embodiment.

Figure 9A:
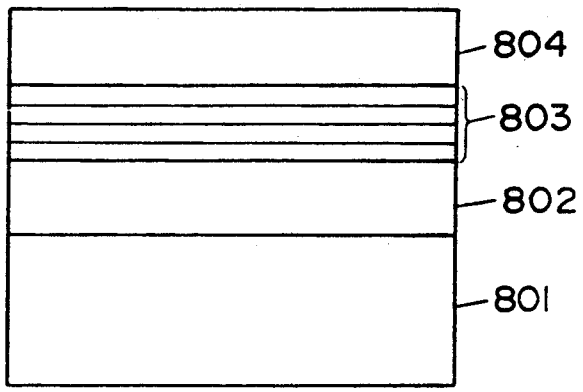
FIGS. 9A-9C are a manufacturing process diagram of the optical magnetic field sensor in the third embodiment of the invention.
Figure 9B:
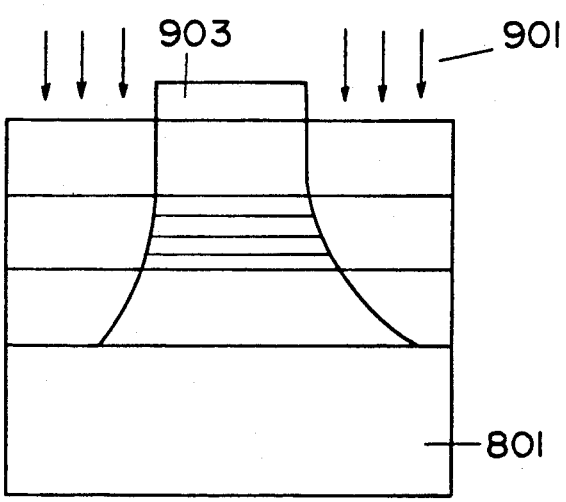
Figure 9C:
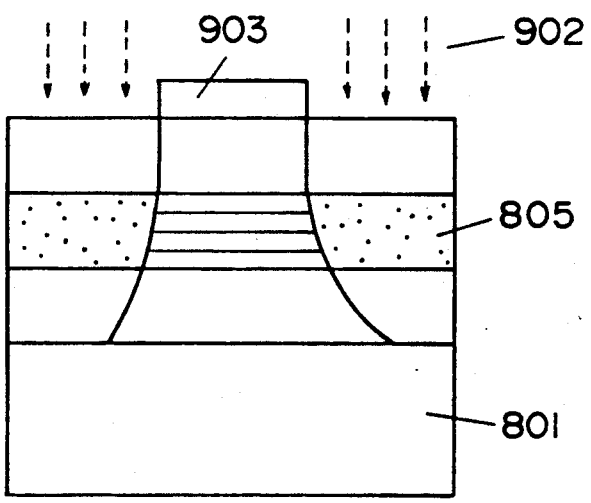

FIG. 9 shows a manufacturing process chart of an optical magnetic field sensor in the third embodiment of the invention, in which the numeral 901 shows an Si ion implantation, and 902 is a proton implantation. First, by organic metal vapor phase growth, the $Al_{0.2}Ga_{0.8}As$ layer 802 is grown to 5 $\mu$m, and the superlattice layer 803 of 100A GaAs/100A $Al_{0.3}Ga_{0.7}As$ 50 periods and $Al_{0.2}Ga_{0.8}Ga_{0.8}As$ layer 804 to 0.1 $\mu$m, sequentially. Using the $SiO_2$ stripe 903 of 5 $\mu$m in width as the mask, Si ions are implanted at an accelerating voltage of 150 keV by $5 \times 10^{12}$ cm$^{-2}$ ions. By annealing for 5 hours at 850° C., the superlattice layer is disordered. Next, proton ions are implanted by using the same $SiO_2$ stripe 903 as the mask.

Meanwhile it may be also possible to use InP as the first semiconductor layer, an INGaAsP/InP multiquantum well layer or InGaAsP as the second semiconductor layer, and proton implanted InP as the third semiconductor layer. Besides, similar effects may be expected when ZnS is used as the first semicondcutor layer, ZnSe/Zns super-lattice layer as the second semiconductor layer, and a proton-implanted ZnS as the third semiconductor layer.

Figure 10:
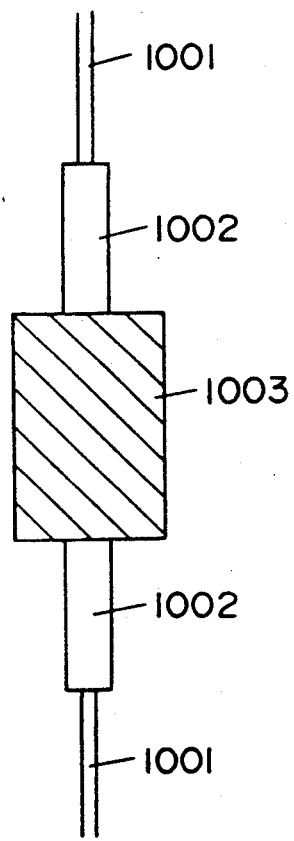
FIG. 10 is a structural drawing an optical magnetic field sensor head in another embodiment of the invention.

FIG. 10 shows the structure of an optical magnetic field sensor in an embodiment of the invention. The light led in by an optical fiber 1001 is coupled with the optical waveguide of a sensor unit 1003 by a coupling lens 1002. In this sensor unit 1003, the change in the external magnetic field is converted into change in the optical intensity, and the light leaving the sensor unit is coupled with the optical fiber 1001 by the coupling lens 1002 to be transmitted therefrom.

Thus, according to this invention, since the magnetic optical crystal, and devices having the functions of a polarizer and an analyzer can be formed at once on a same substrate by using the conventional semiconductor process technology, the optical axis matching process of the sensor unit and others may be omitted, and the reliability is enhance and because adhesive or other resin is not used. Fur since multiple devices can be fabricated at once at the same precision, it excels in mass producibility, and it is extremely advantageous industrially.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. An optical sensor comprising:
   a magnetic optical crystal epitaxially grown on a substrate, a first optical polarizer and a second optical polarizer for polarizing light located at the end of said magnetic optical crystal, wherein said first and second optical polarizer is an alternate multilayer lamination of a metal and dielectric,
   light passes through said first optical polarizer and becomes a linear polarized light, wherein said linear polarized light from the end of said first optical polarizer enters into said magnetic optical crystal, wherein the plane of polarization of said linear polarized light after passing through said magnetic optical crystal is rotated by an angle proportional to the optical path length and external magnetic field, wherein said linear polarized light form said magnetic optical crystal enters into said second optical polarizer, and wherein the quantity of said linear polarized light after passing through said second optical polarizer changes according to the value of said angle of rotation.

2. An optical sensor comprising:
   a magnetic optical crystal epitaxially grown on a substrate, and an optical polarizer for polarizing light located at the end of said magnetic optical crystal, wherein said optical polarizer is an alternate multilayer lamination of a metal and dielectric,
   wherein the linear polarized light enters into said optical crystal such that the plane of polarization of said linear polarized light after passing through said magnetic optical crystal is rotated by an angle proportional to the optical path length and external magnetic field, and wherein said linear polarized light from said magnetic optical crystal enters into said optical polarizer, and a quantity of said linear polarized light, after passing through said optical polarizer, changes according to the value of said angle of rotation.

3. An optical sensor according to claim 1 or 2, wherein said magnetic optical crystal is a II-IV semiconductor, a III-V semiconductor, or a garnet crystal.

4. An optical sensor according to claim 3, wherein said II-Vi semiconductor is ZnSe, ZnS, $ZnS_xSe_{1-x}$.

5. An optical sensor according to claim 3, wherein said III-V semiconductor is GaAs, $Al_xGa_{1-x}As$ $(0<x<1)$.

6. An optical sensor according to claim 3, wherein said garnet crystal is $(Tb_xY_{1-x})_3Fe_5O_{12}$ $(0.1 \leq x \leq 0.3)$, or a Bi substitutional garnet.

7. An optical sensor according to claim 1 or 2, wherein said substrate is a semiconductor or garnet crystal.

8. An optical sensor according to claim 7, wherein said substrate is GaAs, Si, gadolinium-gallium-garnet or a Ga-Mg-Zr substitutional type gadolinium-gallium-garnet.

* * * * *